United States Patent
Murphy et al.

(10) Patent No.: US 7,485,210 B2
(45) Date of Patent: Feb. 3, 2009

(54) SPUTTERING TARGET FIXTURE

(75) Inventors: William J. Murphy, North Ferrisburgh, VT (US); David C. Strippe, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 845 days.

(21) Appl. No.: 10/711,818

(22) Filed: Oct. 7, 2004

(65) Prior Publication Data

US 2006/0076230 A1 Apr. 13, 2006

(51) Int. Cl.
C23C 14/35 (2006.01)

(52) U.S. Cl. .............................. 204/192.12; 204/298.2; 204/298.19

(58) Field of Classification Search ............ 204/192.12, 204/298.18, 298.19, 298.2
See application file for complete search history.

(56) References Cited

U.S. PATENT DOCUMENTS

| | | | |
|---|---|---|---|
| 4,597,847 A | 7/1986 | Boys | |
| 4,957,605 A * | 9/1990 | Hurwitt et al. | 204/192.12 |
| 5,284,564 A | 2/1994 | Maass | |
| 5,558,749 A | 9/1996 | Yokoyama et al. | |
| 5,863,399 A | 1/1999 | Sichmann | |
| 5,944,968 A * | 8/1999 | Kobayashi et al. | 204/298.2 |
| 6,207,028 B1 | 3/2001 | Haas et al. | |
| 6,299,740 B1 | 10/2001 | Hieronymi et al. | |
| 6,402,912 B1 | 6/2002 | Herrera et al. | |
| 6,488,822 B1 | 12/2002 | Moslehi | |

FOREIGN PATENT DOCUMENTS

| | | | |
|---|---|---|---|
| JP | 60-089571 | * | 5/1985 |
| JP | 01-147063 | * | 6/1989 |
| JP | 03-257161 | * | 11/1991 |
| JP | 3287764 | | 12/1991 |
| JP | 04032567 | | 2/1992 |
| JP | 9041135 | | 2/1997 |

OTHER PUBLICATIONS

Simplicity in Sputtering, US Inc., Planar Magnetron Sputtering Source, 7 pages.
Magnetron Sputtering, Plasma Surface Engineering Corporation, TN 0001000 Feb. 2003, 4 pages.
J. R. German, A Simple Low Cost Method for Increased Performance of Planar Magnetron Sputtering Targets, pp. 1-5.

* cited by examiner

*Primary Examiner*—Rodney G McDonald
(74) *Attorney, Agent, or Firm*—Schmeiser, Olsen & Watts; Anthony J. Canale

(57) ABSTRACT

A method and apparatus for sputter deposition. The method including: providing a sputter target having a back surface and an exposed front surface; providing a source of magnetic field lines, the magnetic field lines extending through the sputter target from the back surface to the exposed front surface of the sputter target; providing one or more pole extenders between magnetic poles of the source of the magnetic field lines and the exposed front surface of the sputter target.

1 Claim, 15 Drawing Sheets

SPUTTERING TARGET FIXTURE

FIELD OF THE INVENTION

The present invention relates to the field of sputter deposition; more specifically, it relates to a cathode assembly including a sputtering target and a method for improved efficiency of use of the target.

BACKGROUND OF THE INVENTION

Sputter deposition or physical vapor deposition (PVD) systems are well known and typically include a magnetron cathode assembly and a target. Typically the cathode assembly is placed in a vacuum chamber into which a gas plasma is generated between the target and a substrate, in one example a semiconductor wafer. The magnetic field generated by the magnets in the cathode enhances the ability of ionized atoms to strike the target thus sputtering off target material which is deposited as a layer on the substrate. This process uses up the target, forming sputtering grooves in the target. When the grooves become too deep or deposited film quality starts to degrade, the target must be replaced even though a very large percentage of the target material still remains on the target. Considering the exotic and expensive target materials used in the semiconductor and other industries, target replacement is a very costly. Therefore, there is a need for a efficient magnetron sputtering cathode.

SUMMARY OF THE INVENTION

A first aspect of the present invention is a method of sputter deposition, comprising: providing a sputter target having a back surface and an exposed front surface; providing a source of magnetic field lines, the magnetic field lines extending through the sputter target from the back surface to the exposed front surface of the sputter target; and providing one or more pole extenders between magnetic poles of the source of the magnetic field lines and the exposed front surface of the sputter target.

A second aspect of the present invention is an apparatus, comprising: a sputter target having a back surface and an exposed front surface; a source of magnetic field lines, the magnetic field lines extending through the sputter target from the back surface to the exposed front surface of the sputter target; and one or more pole extenders between magnetic poles of the source of the magnetic field lines and the exposed front surface of the sputter target.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Figure 1A:
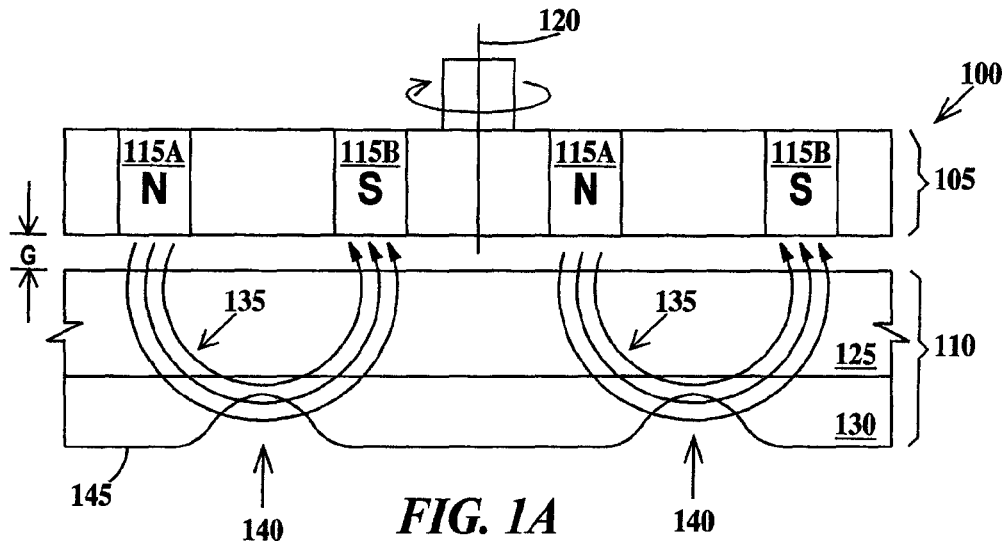
FIG. 1 is a conceptual sectional view and FIG. 1B is a top conceptual view illustrating target erosion in a magnetron cathode assembly.
Figure 1B:
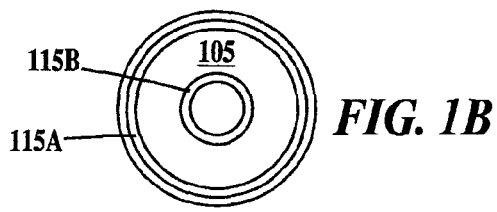
Figure 17:
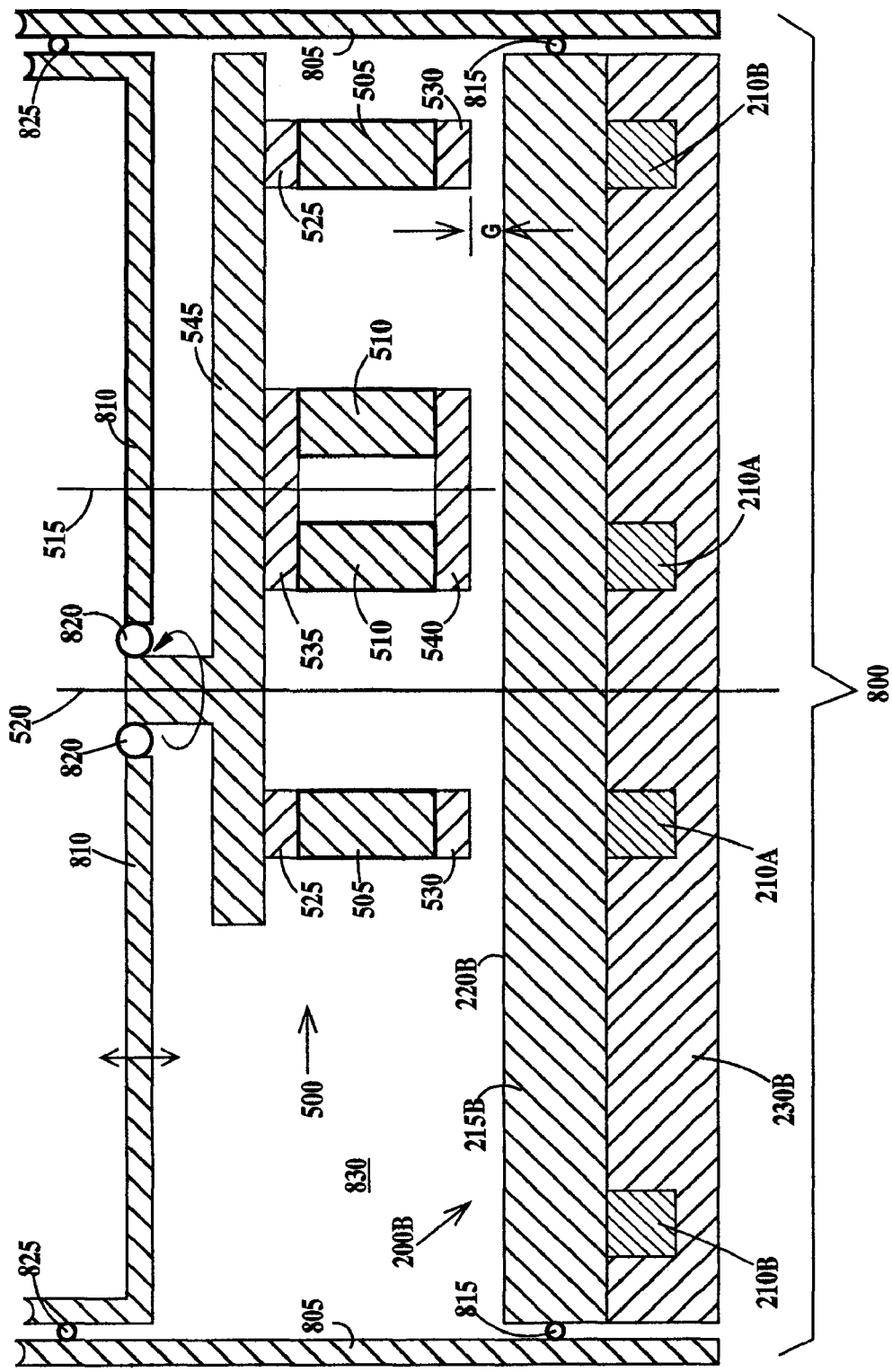
FIG. 17 is a cross-sectional view through an exemplary magnetron cathode assembly according to the present invention.

FIG. 1 is a conceptual sectional view and FIG. 1B is a top conceptual view illustrating target erosion in a magnetron cathode assembly. In FIG. 1A, magnetron cathode assembly 100 includes a rotatable magnet assembly 105 and a cathode assembly 110. Magnet assembly 105 includes magnetic north pole regions 115A and magnetic south pole regions 115B and is rotatable about an axis 120. Generally, axis 120 is off-center from the geometric axis of magnetic assembly 105 as illustrated in FIG. 17 and described infra. It should be understood that north pole and south pole regions 115A and 115B are not the actual magnets, but are intended to show in cross-section, the magnetic fields swept out by the magnets as magnet assembly 105 rotates. As illustrated in FIG. 1B, north and south pole regions 115A and 115B are thus rings within which magnetic flux at any given point along the ring varies as the magnets rotate. Cathode assembly 110 includes a backing plate 125 and a target 130. North and south pole regions 115A and 115B induce magnetic field lines 135 that extend through backing plate 125 and target 130. A circular groove 140 is formed in target 130 where magnetic field lines 135 are approximately parallel to surface 145 of target 130 as the magnetic field enhances sputtering (removal of target material by ion bombardment) in these regions of the target. Groove 140 is smoothed as the magnetic poles are rotated. Groove 140 is formed between north magnetic poles 115A and south magnetic poles 115B and is roughly centered between the poles. There are smaller (both in depth and width) higher order grooves formed inside of groove 140 but they have not been illustrated.

The net magnetic field at target surface 145 is a function of (1) the thickness of backing plate 125 and target 130, (2) a distance G between magnet assembly 105 and cathode assembly 110, (3) the magnetic properties of the target and (4) the electric conductivity of backing plate 125 as far as it effects eddy currents shunted within backing plate 125. These factors result in a reduction in the net magnetic field at target surface 145 as well as limiting the length of the portion of each of magnetic field lines 135 that is parallel to surface 145 of target 130. Backing plate 125 is electrically conductive and non-magnetic. Target 130 is electrically conductive. Decreasing the distance G between magnet assembly 105 and cathode assembly 110 increases the sputtering rate of target 130. Increasing the distance G between magnet assembly 105 and cathode 110 decreases the sputtering rate of target 130. Certain target materials, for example, cobalt, will shunt the magnetic fields and therefore are kept thin.

FIGS. 2 through 10 are conceptual diagrams illustrating the method of increasing target use efficiency in a magnetron cathode assembly using pole extenders according to the present invention. The horizontal direction is defined as the direction parallel to bottom surface 145 of target 140 before any grooves 140 have been formed (see FIG. 1A). The vertical direction is defined as the direction perpendicular to bottom surface 145 of target 140. Axis 120 (see FIG. 1A) extends in the vertical direction.

Figure 2:
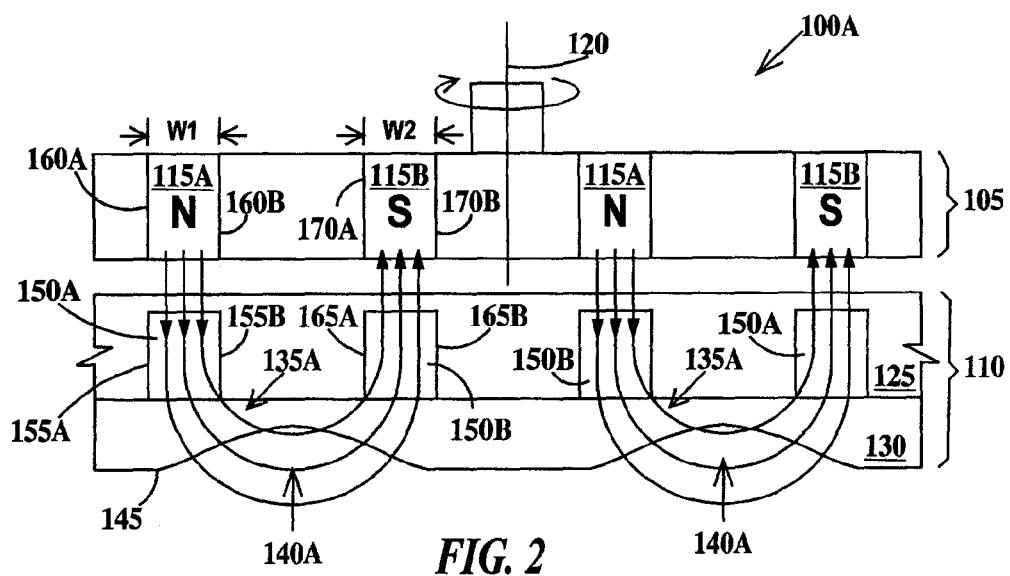
FIGS. 2 through 10 are conceptual diagrams illustrating the method of increasing target use efficiency in a magnetron cathode assembly according to the present invention
Figure 11A:
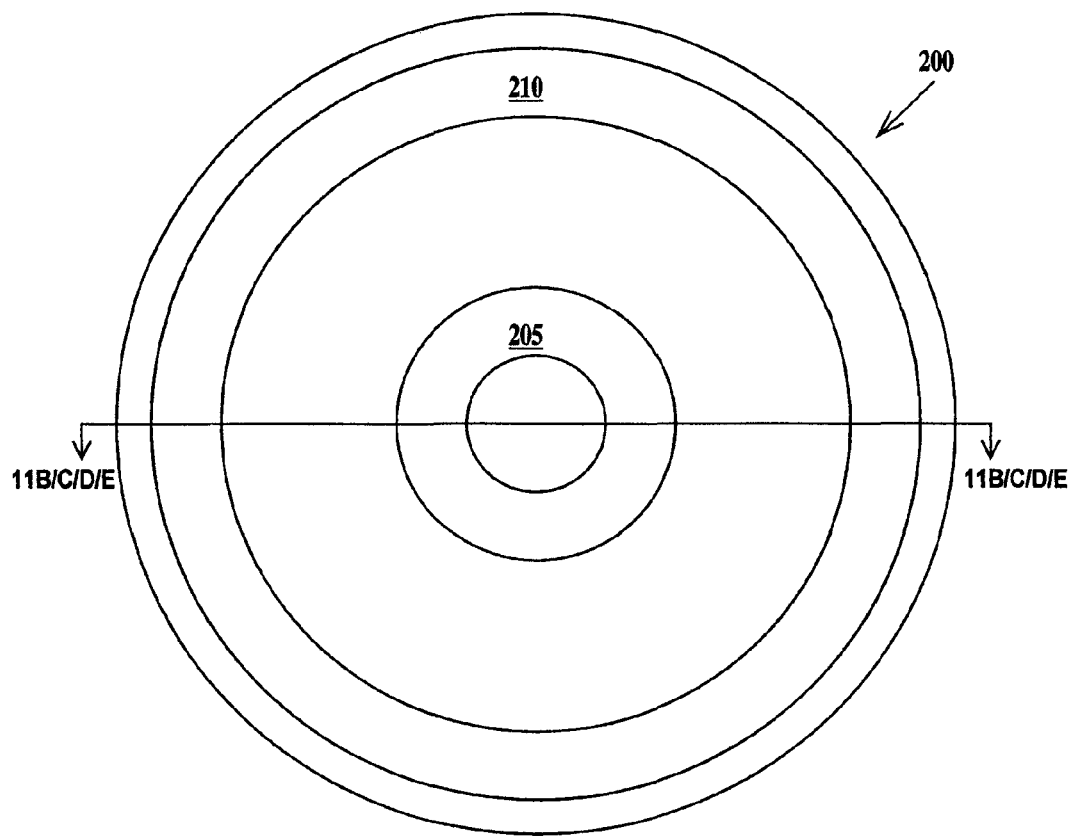
FIG. 11A is a plan view and FIGS. 11B through 11E are cross-sectional views through line 11B/C/D/E-11B/C/D/E of FIG. 11A illustrating various locations for placing pole extenders in a target of a magnetron cathode assembly according to the present invention.
Figure 11B:
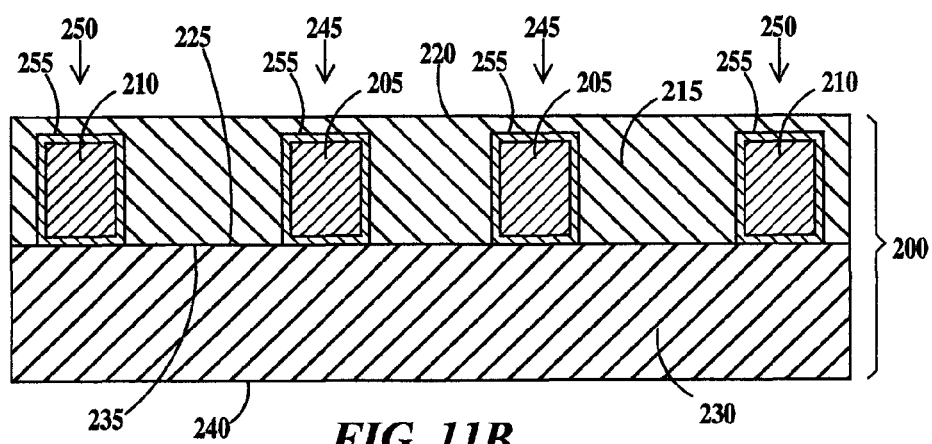

In FIG. 2, magnetron cathode assembly 100A is similar to magnetron assembly 100 of FIG. 1A, except pole extenders 150A and 150B have been embedded in backing plate 125. Pole extenders 150A and 150B are rings as illustrated in FIGS. 11A and 11B (as pole extenders 205 and 210 respectively) and described infra. On one side of axis 120, an outer edge 155A of north pole extender 150A is aligned to an outer edge 160A of north pole region 115A. An inner edge 155B of north pole extender 150A is aligned to an inner edge 160B of north pole region 115A. An outer edge 165A of south pole extender 150B is aligned to an outer edge 170A of south pole region 115B. An inner edge 165B of south pole extender 150B is aligned to an inner edge 170B of south pole region 115B. Pole extenders are formed of a magnetic material. This alignment is mirrored on the opposite side of axis 120.

The presence of pole extenders 150A and 150B result in an increase in the net magnetic field at target surface 145 as well as an increase in the length of the portion of each of magnetic field lines 135A that is parallel to surface 145 of target 130. Increasing the length of the portion of each of magnetic field lines 135A that is parallel to surface 145 of target 130 causes groove 140A of FIG. 2 to be wider than groove 140 of FIG. 1, thus increasing efficiency of target material use. Additionally, the higher order grooves discussed supra, are widened and deepened thus increasing target material utilization efficiency still more.

Pole extenders 150A and 150B have the following impacts: (1) they reduce the effective thickness of backing plate 125 by channeling magnetic flux through the backing pole extender material rather than backing plate material, (2) magnetic poles 115 will appear closer to target 130 than is physically possible(which allows optimal magnet placement for other considerations such as cooling of magnetron cathode assembly 100A), (3) the effect of magnetic target materials on net magnetic field is reduced because of number (1) and (4) the eddy current effect is substantially reduced as the magnetic field is shunted through backing plate 125 rather than within the backing plate.

It should be noted that in FIG. 2, pole extender 150A is about the same width W1 as the magnets (not shown) generating north pole region 115A and co-aligned to those magnets. Also, pole extender 150B is about the same width W2 as the magnets (not shown) generating south pole region 115B and co-aligned to those magnets. FIG. 2 (as do FIGS. 3, 4, 5, 6, 7, 8, 9 and 10) assumes vertical bar or horseshoe magnets (see FIGS. 13A and 13B). With vertical or horseshoe magnets, the north and south pole regions illustrated have a width (or diameter in the case of cylindrical magnets) about equal to the width (or diameter) of the magnet itself. The W1 and W2 dimension of pole extenders 150A and 150B will be different for the W1 and W2 dimensions of horizontal bar magnets (see FIG. 13C).

Figure 3:
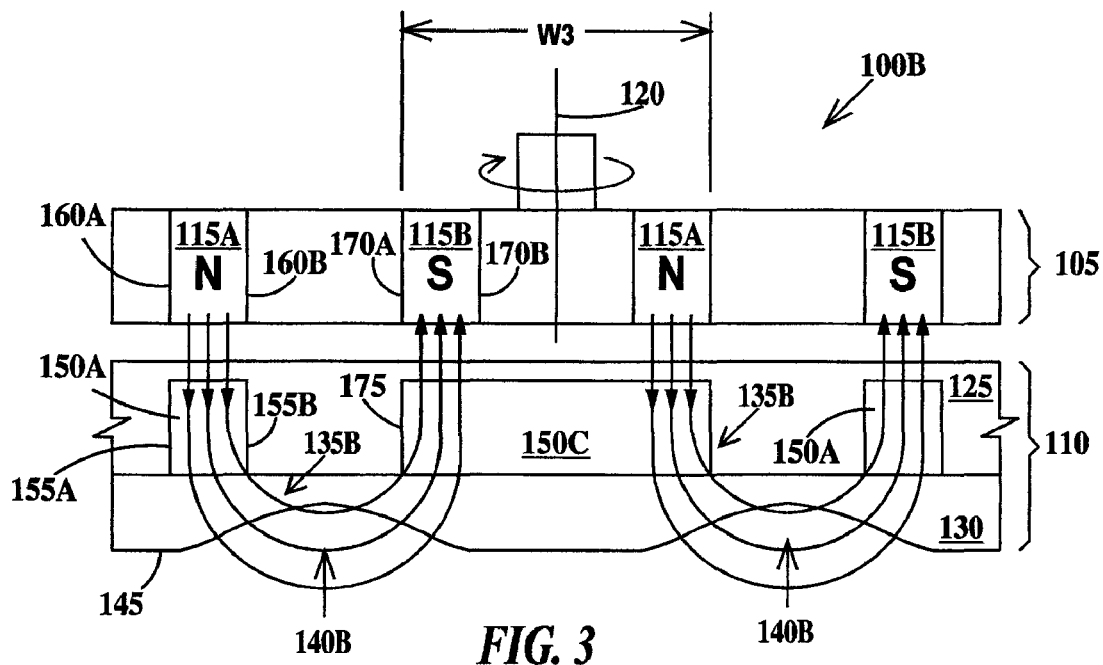

In FIG. 3, magnetron cathode assembly 100B is similar to magnetron assembly 100A of FIG. 2, except pole extender 150A of FIG. 2 is replaced with pole extender 150C. Pole extender 150C is a disk rather than a ring. Pole extender 150C has a width W3 about equal to the outer diameter of an inner magnet assembly (not shown) generating south pole regions 115B. On one side of axis 120, an outer edge 175 of pole extender 150C is aligned to outer edge 170A of south pole region 115B. This alignment is mirrored on the opposite side of axis 120.

Figure 4:
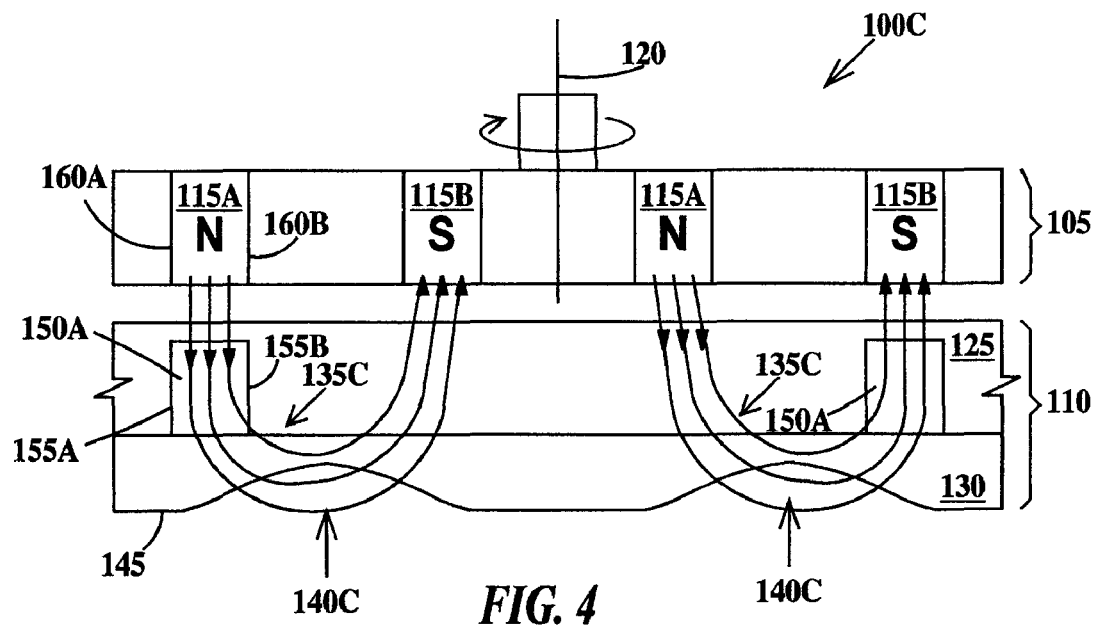

In FIG. 4, magnetron cathode assembly 100C is similar to magnetron assembly 100A of FIG. 2, except pole extender 150B of FIG. 2 is not present in magnetron assembly 100C of FIG. 4.

Figure 5:
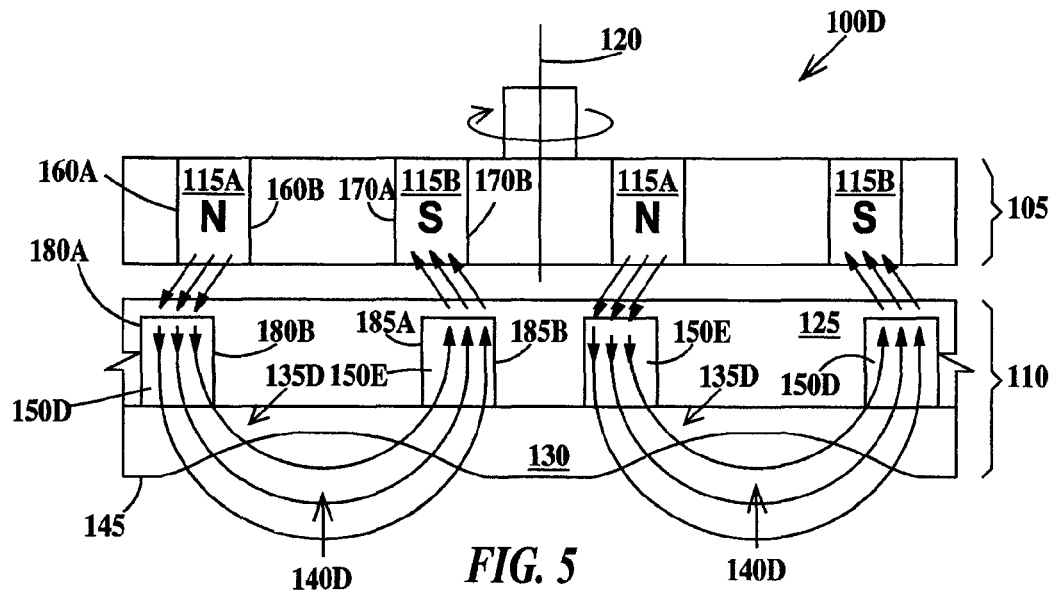

In FIG. 5, magnetron cathode assembly 100D is similar to magnetron assembly 100A of FIG. 2, except on one side of axis 120, an outer edge 180A of a pole extender 150D extends past outer edge 160A of north pole region 115A and an inner edge 180B of pole extender 150D is aligned between outer edge 160A and an inner edge 160B of north pole region 115A. An outer edge 185A of a pole extender 150E is aligned between outer edge 170A and an inner edge 170B of south pole region 115B and an inner edge 185B of pole extender 150E extends past inner edge 170B of south pole region 115B. This has the effect of extending the portion of each magnetic field line 135D that is parallel to surface 145 further, and thus producing a wide groove 140D. This alignment is mirrored on the opposite side of axis 120.

Figure 6:
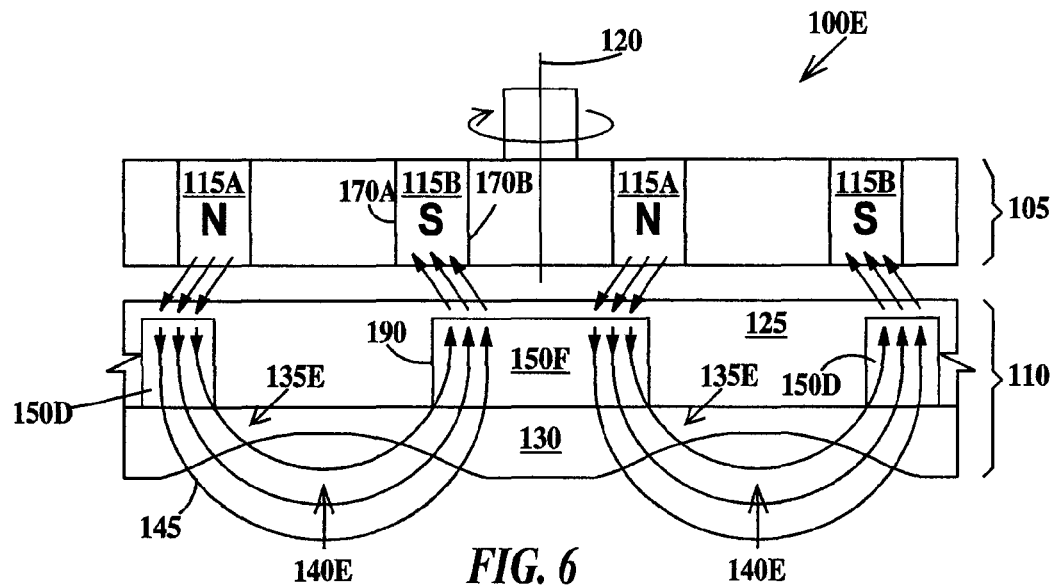

In FIG. 6, magnetron cathode assembly 100E is similar to magnetron assembly 100D of FIG. 5, except pole extender 150E of FIG. 5 is replaced with pole extender 150F. Pole extender 150F is a disk rather than a ring. On one side of axis 120, an outer edge 195 of a pole extender 150F is aligned between outer edge 170A and inner edge 170B of south pole region 115B. This alignment is mirrored on the opposite side of axis 120.

Figure 7:
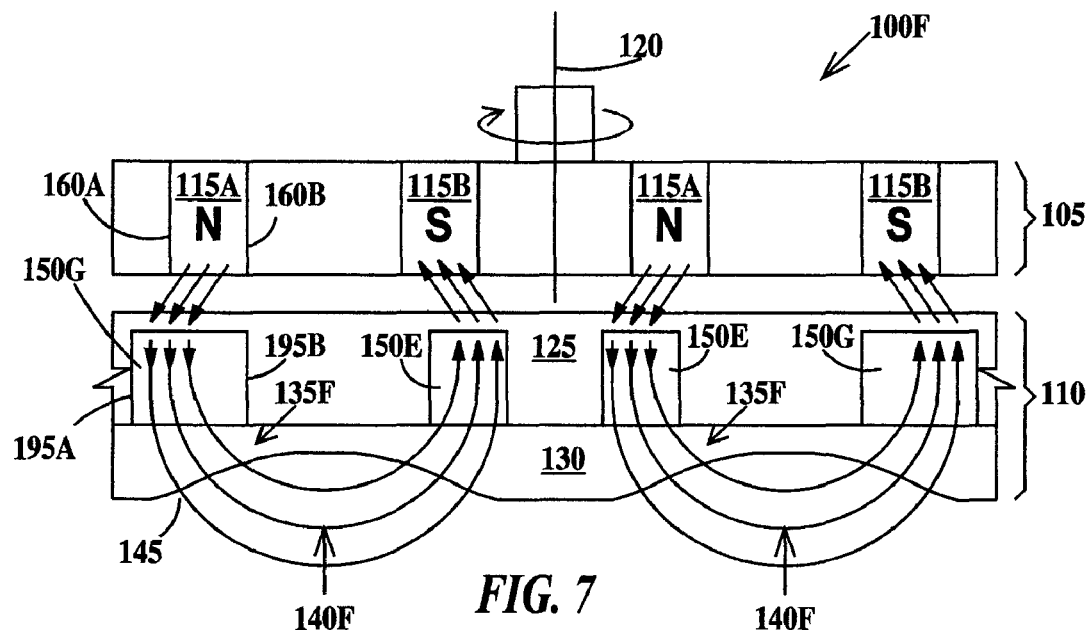

In FIG. 7, magnetron cathode assembly 100F is similar to magnetron assembly 100D of FIG. 5, except pole extender 150G replaces pole extender 150D of FIG. 5. On one side of axis 120, an outer edge 195A of pole extender 150G extends past outer edge 160A of north pole region 115A and an inner edge 195B is aligned to inner edge 160B of north pole region 115A. This alignment is mirrored on the opposite side of axis 120.

Figure 8:
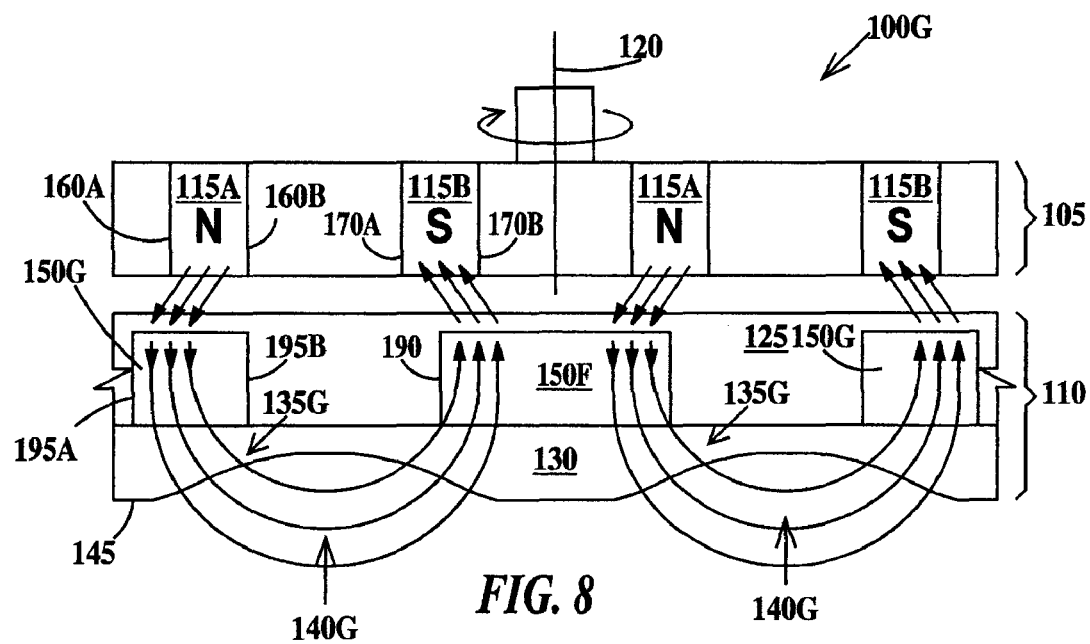

In FIG. 8, magnetron cathode assembly 100G is similar to magnetron assembly 100F of FIG. 7, except pole extender 150F (the same as in FIG. 6) replaces pole extender 150E of FIG. 7. On one side of axis 120, outer edge 190 of a pole extender 150F is aligned between outer edge 170A and inner edge 170B of south pole region 115B. This alignment is mirrored on the opposite side of axis 120.

Figure 9:
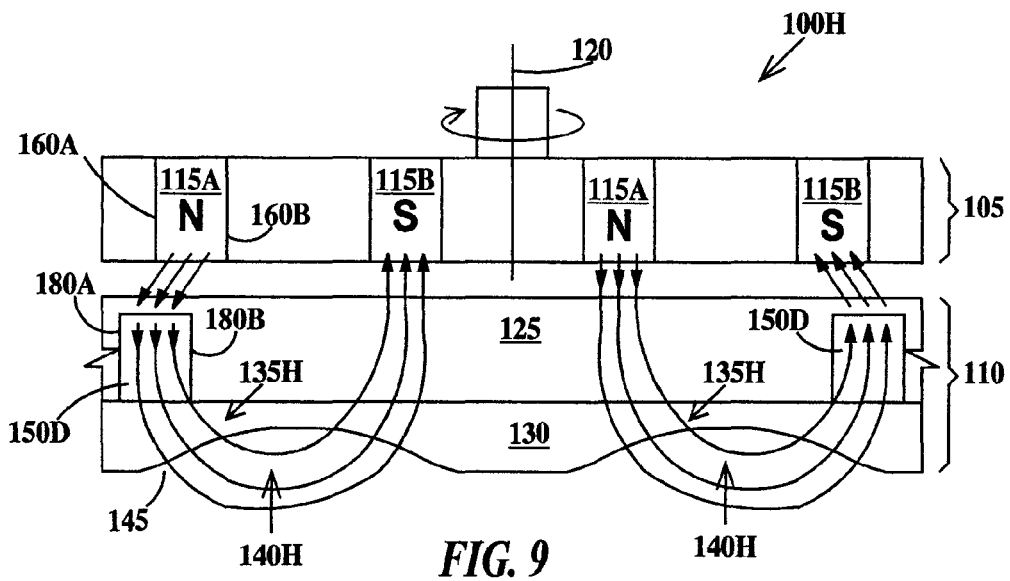

In FIG. 9, magnetron cathode assembly 100H is similar to magnetron assembly 100D of FIG. 5, except pole extender 150E of FIG. 5 is not present in magnetron assembly 100H of FIG. 9.

Figure 10:
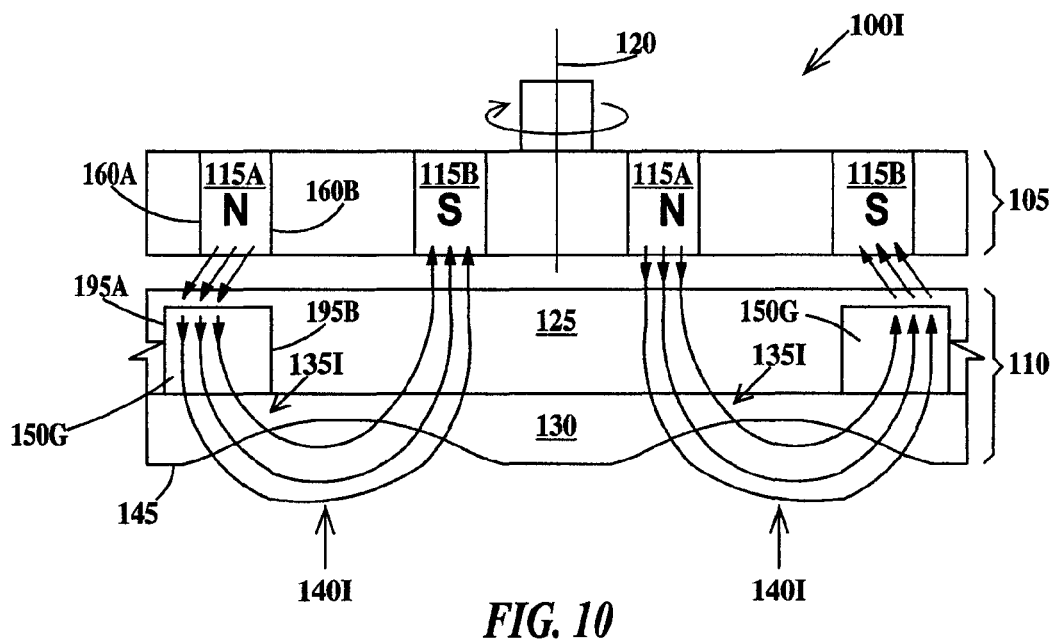

In FIG. 10, magnetron cathode assembly 100I is similar to magnetron assembly 100F of FIG. 7, except pole extender 150E of FIG. 7 is not present in magnetron assembly 100I of FIG. 10.

While FIGS. 2 through 10 have been concerned with options for horizontal locations of the pole extenders the present invention relative to north and south pole regions of the magnet assembly, there are options for the vertical location as well, which are illustrated in FIGS. 11A through 11E and described infra.

FIG. 11A is a plan view and FIGS. 11B through 11E are cross-sectional views through line 11B/C/D/E-11B/C/D/E of FIG. 11A illustrating various locations for placing pole extenders in a target of a magnetron cathode assembly according to the present invention. In FIG. 11A, cathode assembly 200 includes an inner pole extender 205 and an outer pole extender 210. Both inner and outer pole extenders 205 and 210 are illustrated as rings, but inner pole extender 205 may be a disk. In FIG. 11B, cathode assembly 200 includes a backing plate 215 having a top surface 220 and a bottom surface 225 and a target 230 having a top surface 235 and a bottom surface 240. Bottom surface 225 of backing plate 215 is in physical and electrical contact with top surface 235 of target 230. Inner and outer pole extenders 205 and 210 are fitted respectively in annular slots 245 and 250 formed in and open to bottom surface 225 of backing plate 215. Pole extenders 205 and 210 are coated with an optional galvanic corrosion or chemical corrosion protection coating 255 for cases where the material of either backing plate 215, target 230 or both would galvanically or chemically react with the material of the pole extenders. Pole extenders 205 and 210 contact top surface 235 of target 230. Inner and outer pole extenders 205 and 210 need not fit tightly in slots 245 and 250 respectively.

Suitable materials for pole extenders 205 and 210 is not limited to iron, iron alloys, cobalt and other electrically conductive magnetic materials, a magnetic material being defined as a material that may be strongly magnetized or that can channel magnetic fields. Both inner and outer pole extenders 205 and 210 need not be the same material. Suitable materials for backing plate 215 includes but is not limited to aluminum, copper, brass, stainless steel and other electrically conductive non-magnetic materials. A non-magnetic material is defined as a material that cannot not be strongly magnetized or is poor at channeling magnetic fields. Suitable target materials for target 230 include, but are not limited to copper, tantalum, aluminum, platinum, cobalt, gold, titanium, tungsten, other refractory metals, other electrically conductive materials and alloys thereof. The invention may be applied to non-metallic sputtering. In the case of non-metallic sputtering suitable target materials for target 230 include, but are not limited to carbon, silicon oxide, tantalum oxide, aluminum oxide, other metal oxides and other dielectric materials. Suitable materials for optional galvanic or chemical corrosion protection coating 255 include but are not limited to metal nitrides, plated metals and organic or ceramic coatings.

Figure 11C:
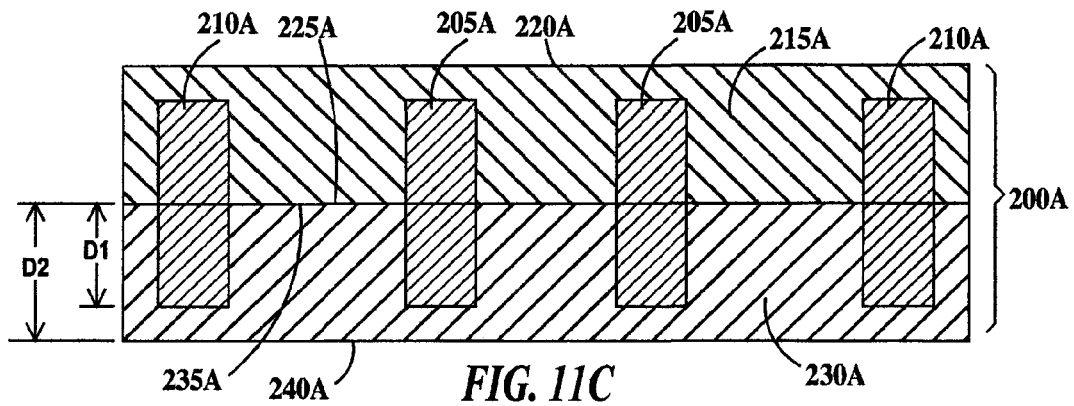
Figure 11D:
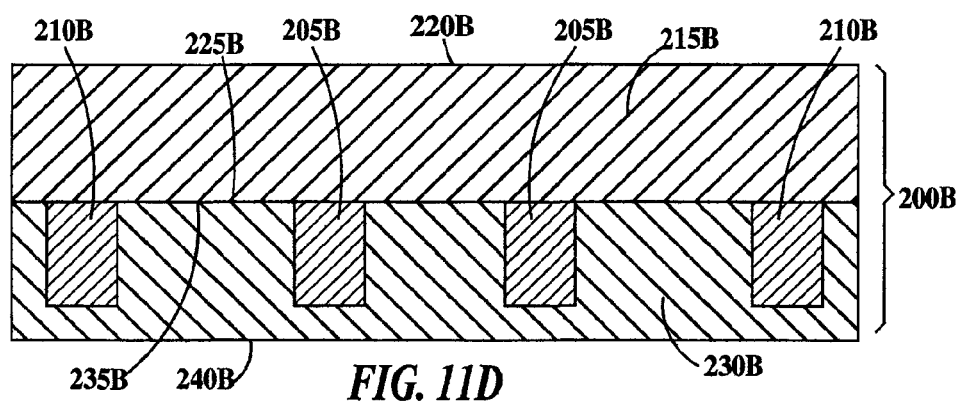
Figure 11E:
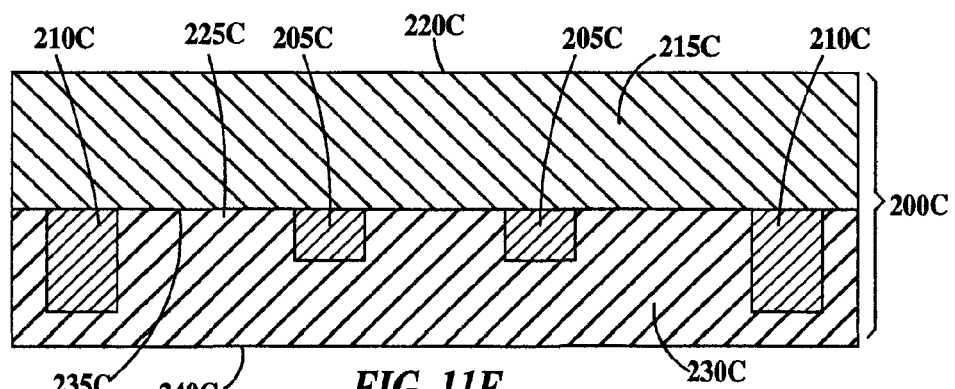

In FIGS. 11C through 11E, optional galvanic corrosion protection coating 255 is not illustrated, but may be present. FIG. 11C is similar to FIG. 11B except in FIG. 11C, an inner pole extender 205A and an outer pole extender 210A are embedded in backing plate 215 and extend a distance D1 into a target 230A. Target 230A has a thickness D2 and, in one example, the ratio D1/D2 does not exceed about 0.8. FIG. 11D is similar to FIG. 11C except in FIG. 11D, an inner pole extender 205B and an outer pole extender 210B are embedded just in target 230A. FIG. 11D is similar to FIG. 11D except in FIG. 11E, inner pole extender 205C and an inner pole extender 205C is not embedded as deeply into a target 200C as outer pole extender 210B is embedded.

Figure 11F:
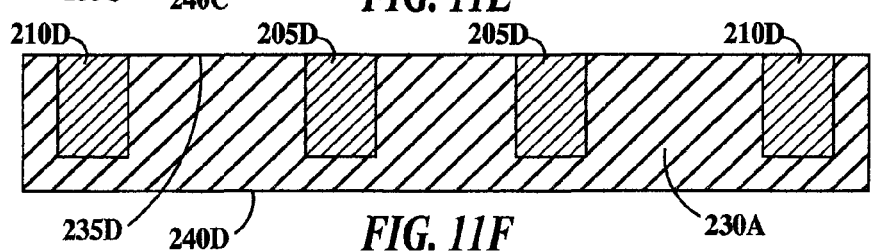
FIG. 11F is a cross-sectional view of a cathode only cathode assembly according to the present invention.

FIG. 11F is a cross-sectional view of a cathode only cathode assembly according to the present invention. A cathode only cathode assembly is defined as a cathode assembly that does not have a backing plate. In FIG. 11F, there is no backing plate and an inner pole extender 205D and an outer pole extender 210D are embedded in target 230D. Target 230D is mounted directly into a magnetron cathode assembly (see FIG. 17). All embodiments of the present invention (except those where pole extenders are illustrated and described as extending into a backing plate) may be applied to cathode only magnetron assemblies.

Though not illustrated, the inner pole extender may be embedded deeper into the target than outer the outer pole extender and the inner and outer pole extenders of unequal extension into the target may also extend into the backing plate. Inner and outer pole extenders need not extend the same distance into the backing plate.

Both horizontal and vertical locations of pole extenders in cathode assemblies have been discussed. Attention will know be turned to the cross-sectional geometry of pole extenders. All pole extenders described or illustrated supra have had rectangular or square cross-sectional geometries. FIGS. 12A through 12I are cross-sectional views illustrating various other cross-sectional geometries and combinations for pole extenders according to the present invention. The pole extender shapes illustrated in FIGS. 12A through 12I allow manipulation of the geometry of the magnetic field lines of a magnetron cathode assembly (see FIG. 17 for an example of a magnetron cathode assembly). Optional galvanic corrosion or chemical corrosion protection coatings are not illustrated in FIGS. 12A through 12I, but may be present. Also only the case of pole extenders contained completely within the target are illustrated, but it should be understood the pole extender cross-sectional geometries described infra are applicable that any of the vertical location options illustrated in FIGS. 11B through 11E and/or discussed supra. Unless otherwise note, the inner and outer pole extenders illustrated in FIGS. 12A through 12I are rings.

Figure 12A:
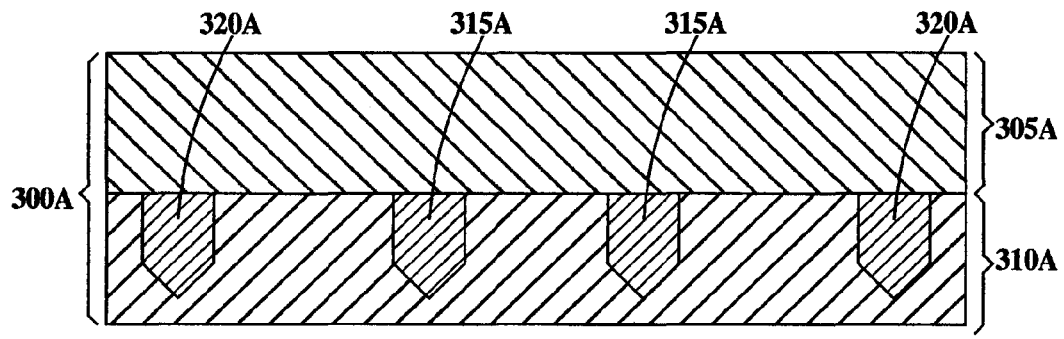
FIGS. 12A through 12I are cross-sectional views illustrating various cross-sectional geometries for pole extenders according to the present invention.

In FIG. 12A, a cathode assembly 300A includes a backing plate 305A and a target 310A. Target 310A includes an inner pole extender 315A and an outer pole extender 320A. Inner and outer pole extenders 315A and 320A have a cross-sectional geometry of a rectangle with two adjacent corners chamfered to meet in a point. The points of inner and outer pole extenders 315A and 320A facing an exposed surface 325A of target 310A.

Figure 12B:
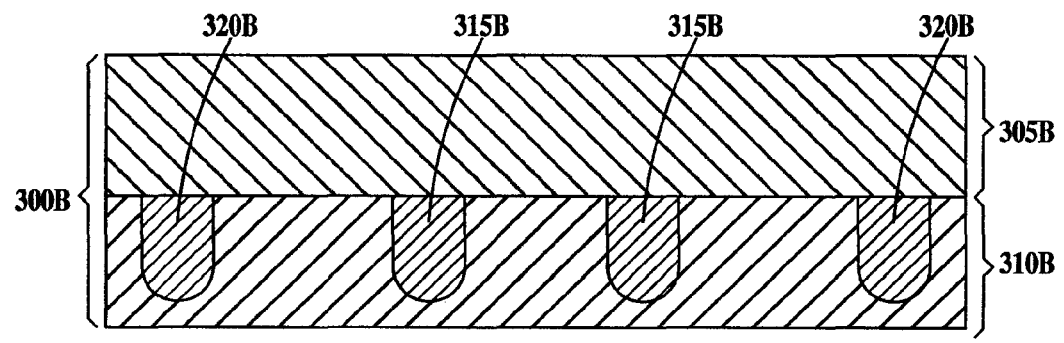

In FIG. 12B, a cathode assembly 300B includes a backing plate 305B and a target 310B. Target 310B includes an inner pole extender 315B and an outer pole extender 320B. Inner and outer pole extenders 315B and 320B have a cross-sectional geometry of a rectangle with two adjacent corners filleted to form a semicircle or curve. The semicircular surface of inner and outer pole extenders 315B and 320B facing an exposed surface 325B of target 310B.

Figure 12C:
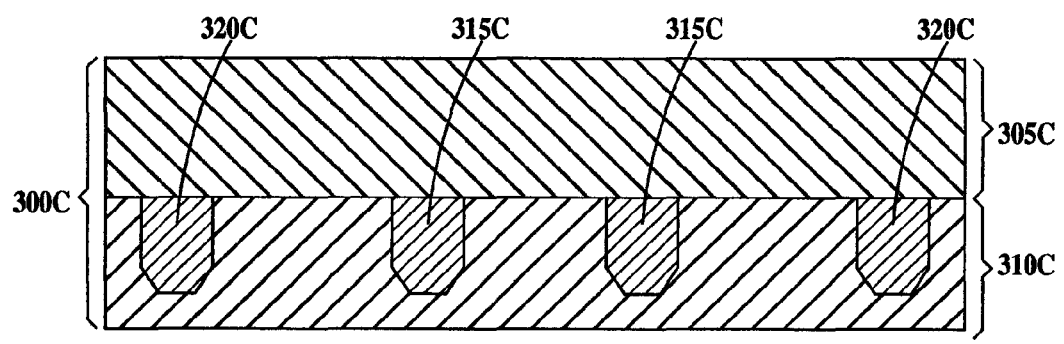

In FIG. 12C, a cathode assembly 300C includes a backing plate 305C and a target 310C. Target 310C includes an inner pole extender 315C and an outer pole extender 320C. Inner and outer pole extenders 315C and 320C have a cross-sectional geometry of a rectangle with two adjacent corners chamfered but still retaining a flat surface between the chamfered corners. The flat surface of inner and outer pole extenders 315C and 320C facing an exposed surface 325C of target 310C.

Figure 12D:
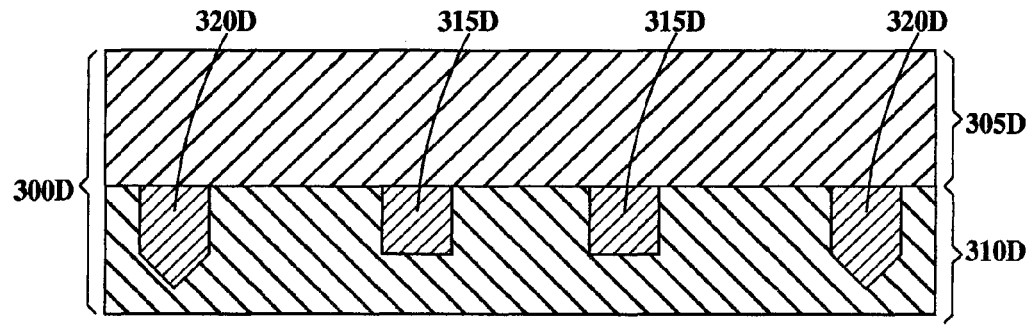

In FIG. 12D, a cathode assembly 300D includes a backing plate 305D and a target 310D. Target 310D includes an inner pole extender 315D and an outer pole extender 320D. Inner pole extender 315D has a cross-sectional geometry of a rectangle. Outer pole extender 320D has a cross-sectional geometry of a rectangle with two adjacent corners chamfered to meet in a point. The points of inner and outer pole extenders 315D and 320D facing an exposed surface 325D of target 310D.

Figure 12E:
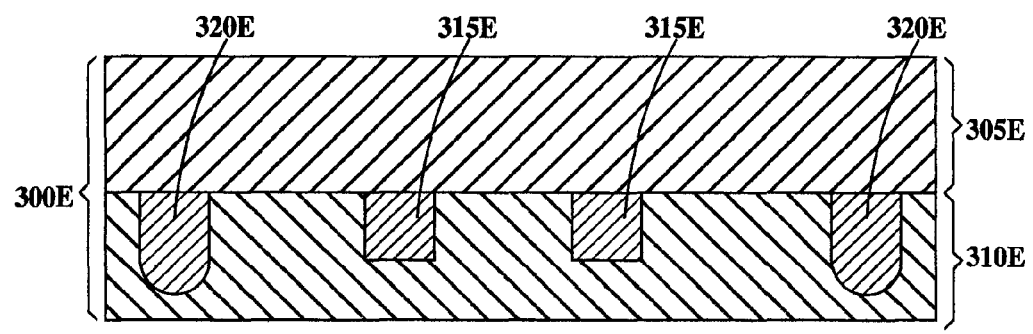

In FIG. 12E, a cathode assembly 300E includes a backing plate 305E and a target 310E. Target 310E includes an inner pole extender 315E and an outer pole extender 320E. Inner pole extender 315E has a cross-sectional geometry of a rectangle. Outer pole extender 320E has a cross-sectional geometry of a rectangle with two adjacent corners filleted to form a semicircle or curve. The curved or semi-circular surfaces of inner and outer pole extenders 315E and 320E facing an exposed surface 325E of target 310E.

Figure 12F:
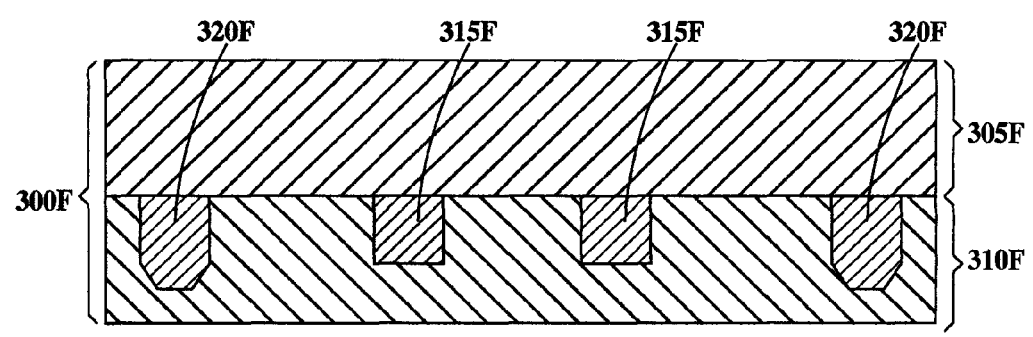

In FIG. 12F, a cathode assembly 300F includes a backing plate 305F and a target 310F. Target 310F includes an inner pole extender 315F and an outer pole extender 320F. Inner pole extender 315F has a cross-sectional geometry of a rectangle. Outer pole extender 320F has a cross-sectional geometry of a rectangle with two adjacent corners chamfered but still retaining a flat surface between the chamfered corners. The flat surfaces between chamfered corners of inner and outer pole extenders 315F and 320F facing an exposed surface 325F of target 310F.

Figure 12G:
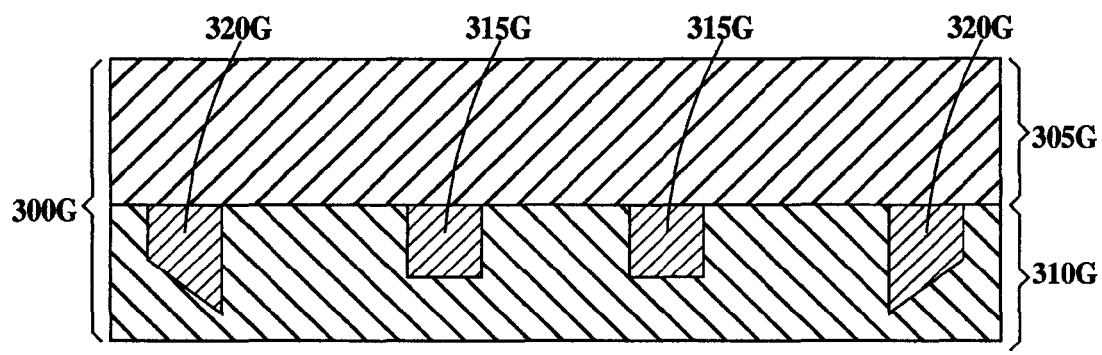

In FIG. 12G, a cathode assembly 300G includes a backing plate 305G and a target 310G. Target 310G includes an inner pole extender 315G and an outer pole extender 320G. Inner pole extender 315G has a cross-sectional geometry of a rectangle. Outer pole extender 320G has a cross-sectional geometry of a rectangle having two opposite sides of unequal length joined by a sloped surface, the sloped surface facing an exposed surface 325G of target 310G, and the sloped surface of outer pole extender 320G facing away from inner pole extender 315G.

Figure 12H:
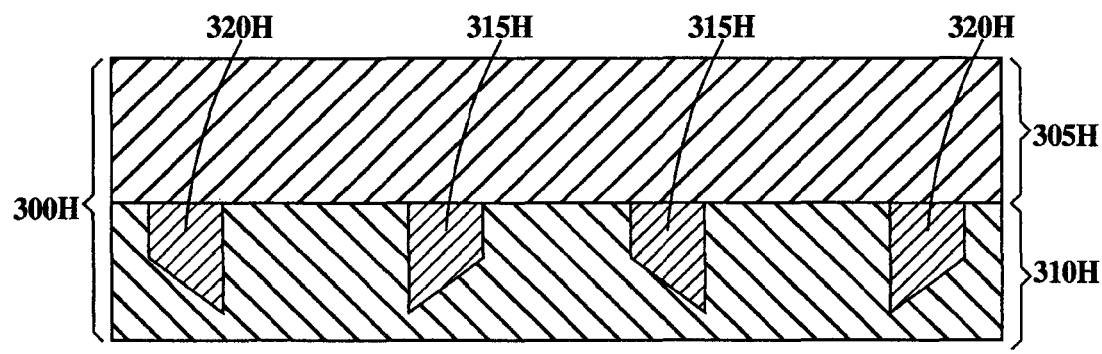

In FIG. 12H, a cathode assembly 300H includes a backing plate 305H and a target 310H. Target 310H includes an inner pole extender 315H and an outer pole extender 320H. Inner pole extender 315H has a cross-sectional geometry of a rectangle. Inner and outer pole extenders 315H and 320H have a cross-sectional geometry of a rectangle having two opposite sides of unequal length joined by a sloped surface, the sloped surface facing an exposed surface 325H of target 310H, and the longest side of inner pole extender 315H facing the longest side of outer pole extender 320H.

Figure 12I:
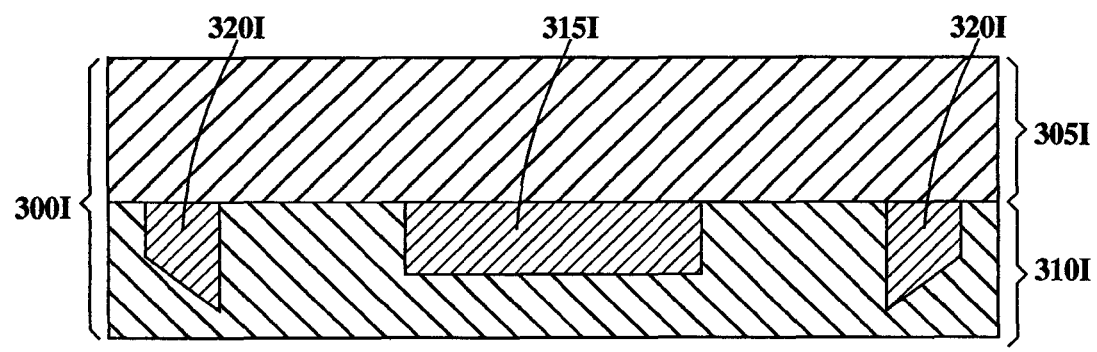

In FIG. 12I, a cathode assembly 300I includes a backing plate 305I and a target 310I. Target 310I includes a disk inner pole extender 315I in the form of a and an outer pole extender 320I. Inner pole extender 315I has a cross-sectional geometry of a rectangle. Outer pole extender 320I has a cross-sectional geometry of a rectangle having two opposite sides of unequal length joined by a sloped surface, the sloped surface facing an exposed surface 325I of target 310I, and the sloped surface of outer pole extender 320I facing away from inner pole extender 315I.

FIGS. 12 through 12I should be exemplary, as many other pole extender cross-sectional geometries and combinations of different inner and outer pole extender cross-sectional geometries are possible.

Figure 13A:
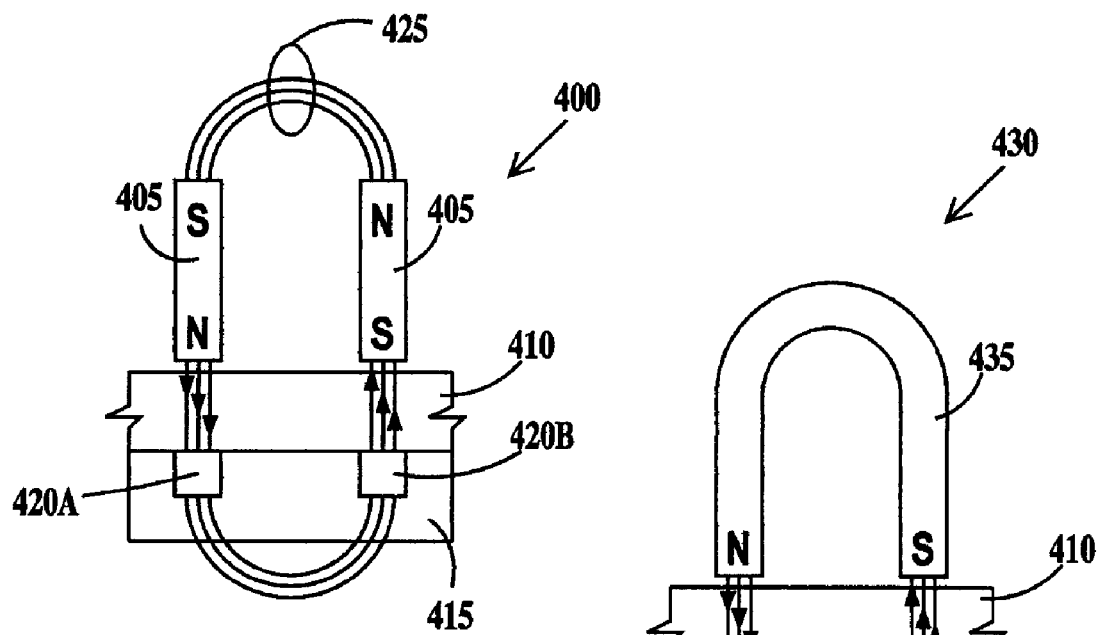
FIGS. 13A through 13C are partial side sectional views of magnetron cathode assemblies illustrating the general placement of various magnet shapes in relationship to the pole extenders of the present invention.
Figure 13B:
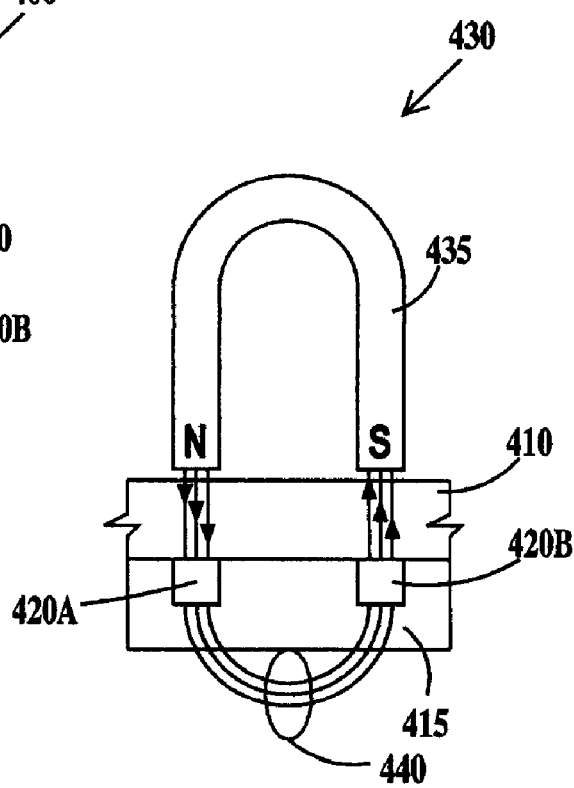
Figure 13C:
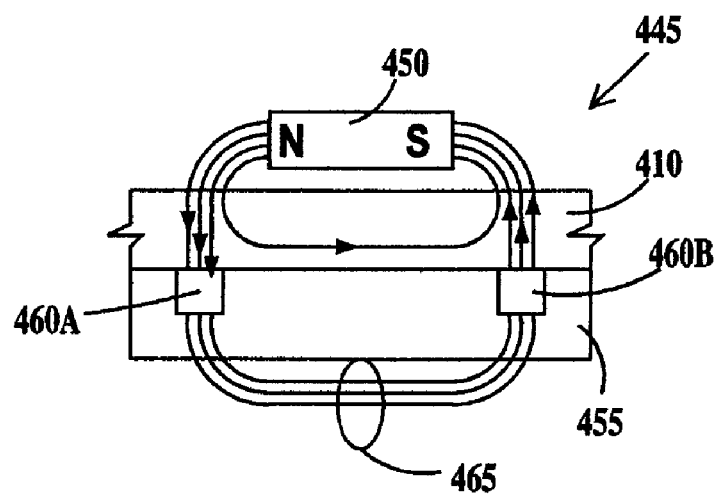

FIGS. 13A through 13C are partial side sectional views of magnetron cathode assemblies illustrating the general placement of various magnet shapes in relationship to the pole extenders of the present invention. In FIG. 13A, a magnetron cathode assembly 400 includes vertical bar magnets 405, a backing plate 410 and a target 415 including pole extenders 420A and 420B. Each vertical bar magnet 405 is shown aligned to either pole extender 420A or 420B. Real time positioning varies for inner pole extenders and depends on where in their circle of rotation the magnets are relative to backing plate 410 and target 415. Magnetic field lines 425 form a closed loop through magnets 405 and pole extenders 420A and 420B. In the case of vertical bar magnets, the pole extenders are aligned to the pole ends of the vertical bar magnets, at least a portion of each pole extender positioned under a corresponding pole of a vertical bar magnet (in at least a portion of the rotation cycle of the magnet).

In FIG. 13B, a magnetron cathode assembly 430 includes a vertical horseshoe magnet 435, backing plate 410 and target 415 including pole extenders 420A and 420B. Each pole of vertical horseshoe magnet 435 is shown aligned to a pole extender 420A or 420B. Real time positioning varies for inner pole extenders and depends on where in their circle of rotation the vertical horseshoe magnet is relative to backing plate 410 and target 415. Magnetic field lines 440 form a closed loop through vertical horseshoe magnet 435 and pole extenders 420A and 420B. In the case of a vertical horseshoe magnets, the pole extenders are aligned to the pole ends of the magnet, at least a portion of each pole extender positioned under a corresponding pole of the magnet (in at least a portion of the rotation cycle of the magnet).

In FIG. 13C a magnetron cathode assembly 445 includes horizontal bar magnets 450, backing plate 410 and a target 455 including pole extenders 460A and 460B. Pole extenders 460A and 460B are positioned in target 455 where magnetic field 465 is most perpendicular to exposed surface 470 of target 455. Both pole extenders 460A and 460B must intercept at least a portion of magnetic field 450 during at least a portion of the rotation cycle of horizontal bar magnet 450. Real time positioning varies for inner pole extenders and depends on where in their circle of rotation the magnet is relative to backing plate 410 and target 415. Magnetic field lines 465 form a closed loop through horizontal bar magnet 450 and pole extenders 460A and 460B.

Figure 14A:
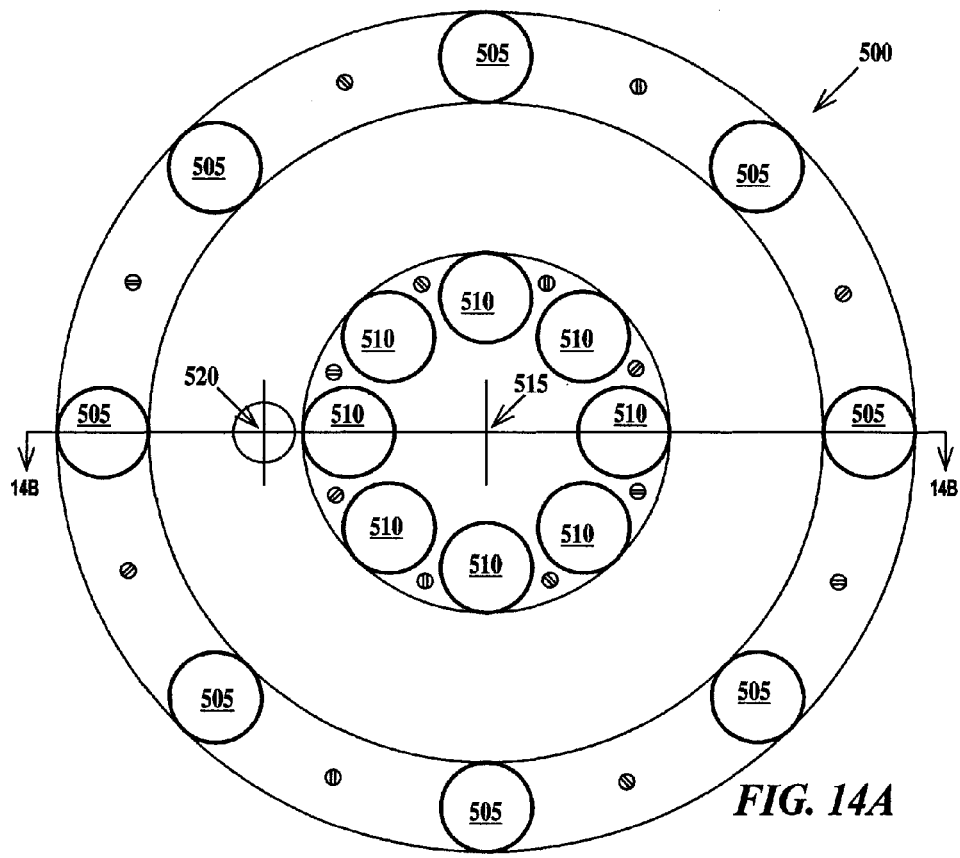
FIG. 14A is a top plan view and FIG. 14B is cross sectional side view through line 14B-14B of FIG. 14A illustrating a first type of magnet assembly suitable for use in the present invention.
Figure 14B:
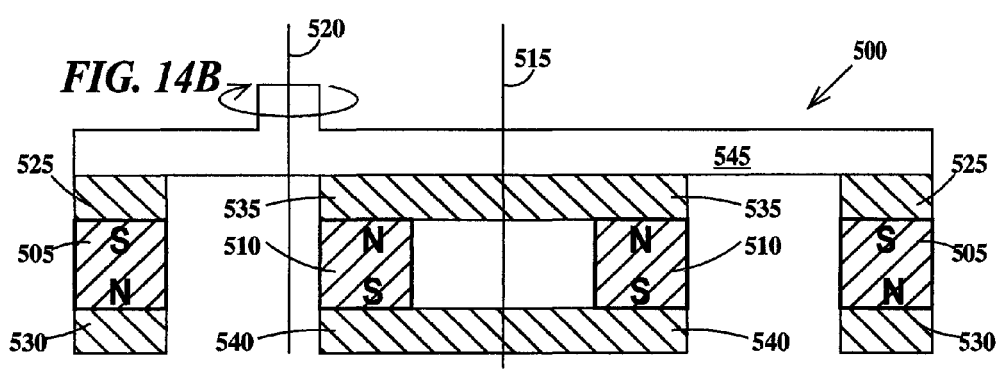

FIG. 14A is a top plan view and FIG. 14B is cross sectional side view through line 14B-14B of FIG. 14A illustrating a first type of magnet assembly suitable for use in the present invention. In FIG. 14A a rotatable magnet assembly 500 includes a ring of outer of vertical bar magnets 505 and a ring of inner vertical bar magnets 510. Outer vertical bar magnets 505 are arranged equidistant from one another and the same distance from a geometric center 515 of magnet assembly 500. Inner vertical bar magnets 505 are arranged equidistant from one another and the same distance from a geometric center 515 of magnet assembly 500, but closer to geometric center 515 than outer vertical bar magnets 505. Magnet assembly 500 is rotatable about a rotation axis 520 located between inner vertical bar magnets 510 and outer vertical bar magnets 505.

Turning to FIG. 14B, outer vertical bar magnets 505 are contained between an upper ring 525 and a lower ring 530. Inner vertical bar magnets 510 are contained between and upper disk 535 and a lower disk 540. Upper ring 525, lower ring 530, upper disk 535 and lower disk 540 are fabricated from electrically conductive magnetic materials. The subassembly formed of upper ring 525, lower ring 530, upper disk 535 and lower disk 540, inner vertical bar magnets 510 and outer vertical bar magnets 505 is fastened to a support plate 545 fabricated from electrically conductive but non-magnetic material. The magnetic poles of all inner vertical bar magnets 510 are orientated in the a first direction and the magnetic poles of all outer vertical bar magnets are orientated in an opposite second direction.

Figure 15A:
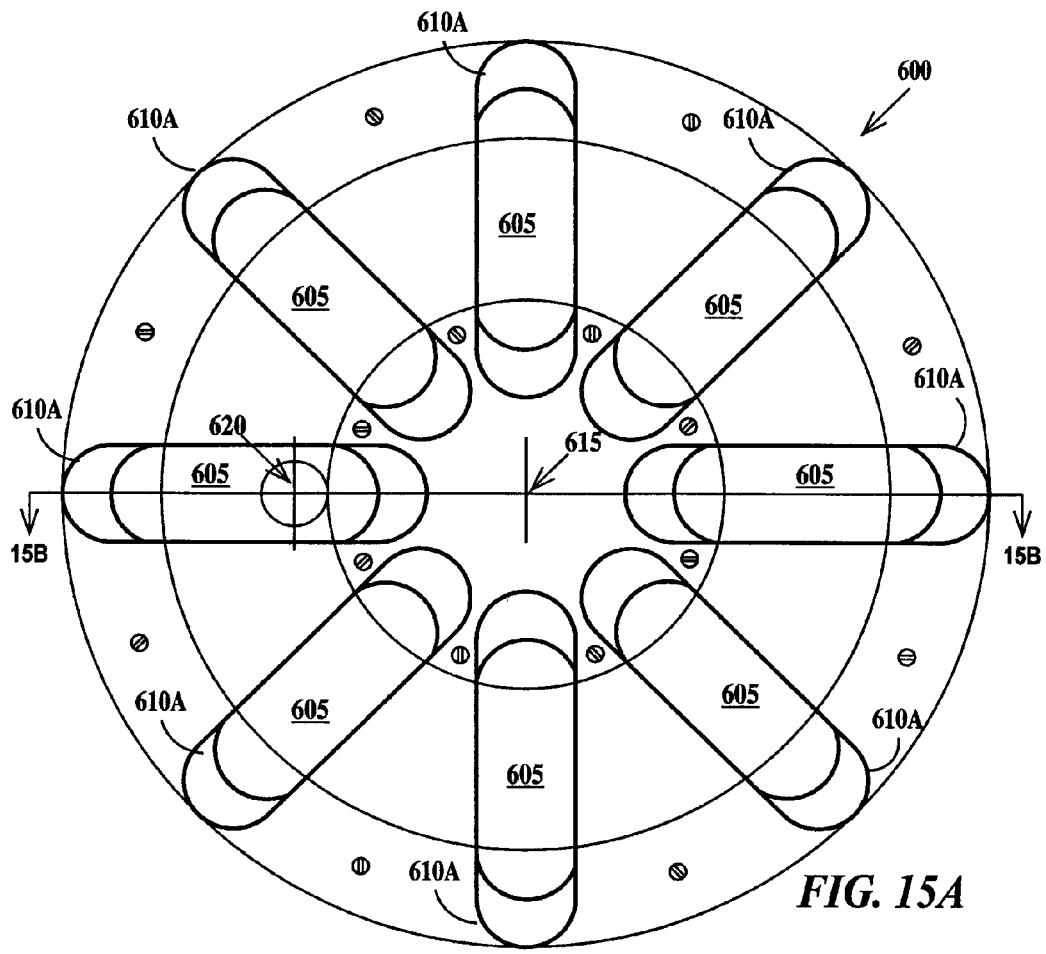
FIG. 15A is a top plan view and FIG. 15B is cross sectional side view through line 15B-15B of FIG. 15A illustrating a second type of magnet assembly suitable for use in the present invention.
Figure 15B:
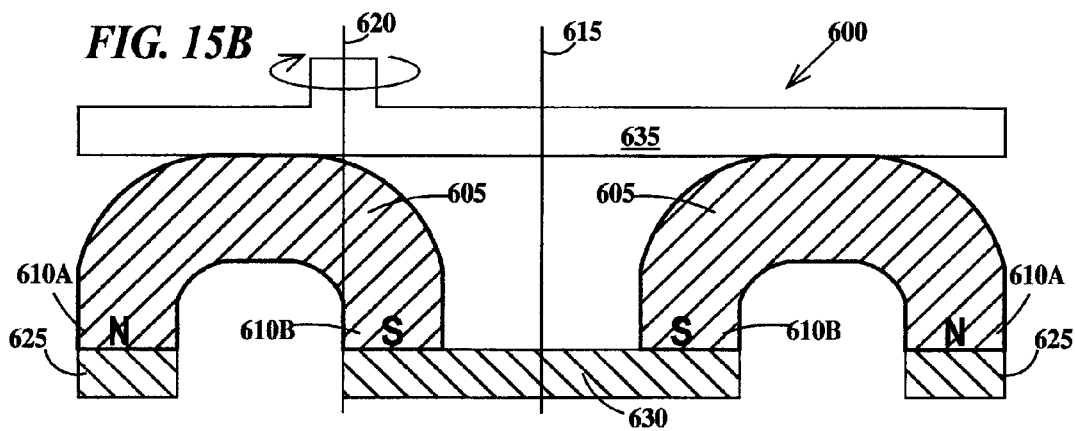

FIG. 15A is a top plan view and FIG. 15B is cross sectional side view through line 15B-15B of FIG. 15A illustrating a second type of magnet assembly suitable for use in the present invention. In FIG. 15A, a rotatable magnet assembly 600 includes an circular array of ring of horseshoe magnets 605 are arranged like the spokes of a wheel. The same first magnetic poles 610A of each horseshoe magnet 605 are arranged in a circle a uniform distance from a geometric center 615 of magnet assembly 600. The same second magnetic poles 610B of each horseshoe magnet 605 arranged in a circle a uniform distance from a geometric center 615 of magnet assembly 600, but closer to geometric center 615 than first magnetic poles 610A. Magnet assembly 600 is rotatable about a rotation axis 620 located between the circle of first magnetic poles 610A and the circle of second magnetic poles 610B.

Turning to FIG. 15B, horseshoe magnets 605 are attached to an outer ring 625 and an inner disk 630. First magnetic poles 610A of each horseshoe magnet 605 are in electrical contact with outer ring 625. Second magnetic poles 610B of each horseshoe magnet 605 are in electrical contact with inner disk 630. Outer ring 625 and inner disk 630 are fabricated from electrically conductive magnetic materials. The subassembly formed of inner ring 630, outer ring 625 and horseshoe magnets 605 are fastened to a support plate 635 fabricated from electrically conductive but non-magnetic material.

Figure 16A:
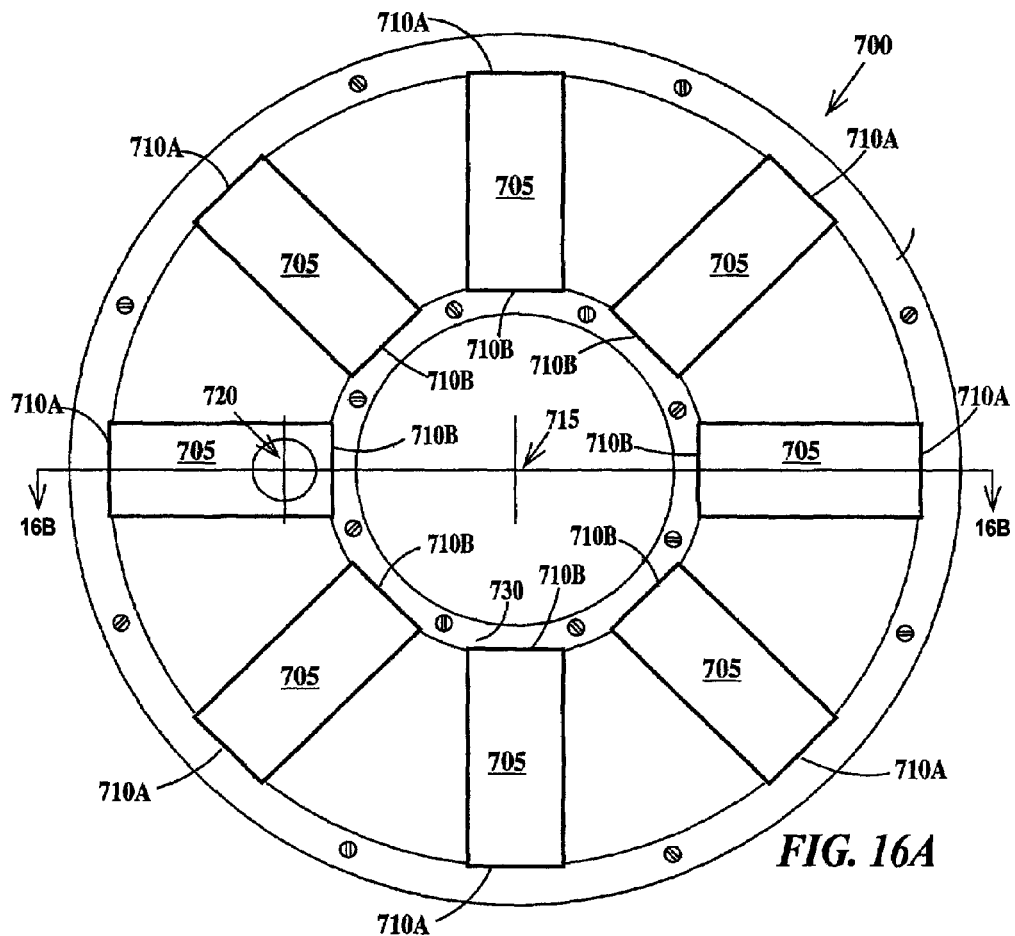
FIG. 16A is a top plan view and FIG. 16B is cross sectional side view through line 16B-16B of FIG. 16A illustrating a third type of magnet assembly suitable for use in the present invention.
Figure 16B:
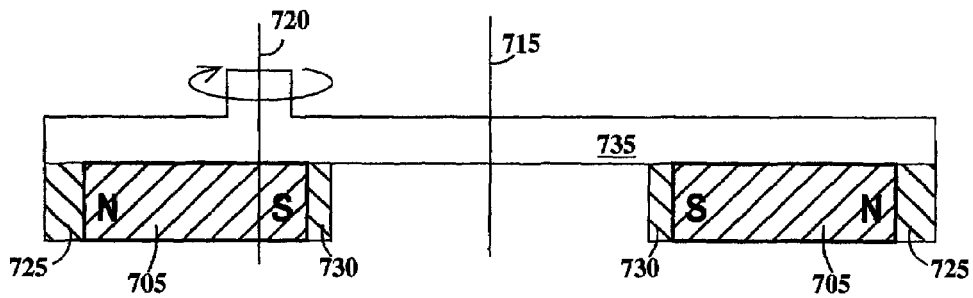

FIG. 16A is a top plan view and FIG. 16B is cross sectional side view through line 16B-16B of FIG. 16A illustrating a third type of magnet assembly suitable for use in the present invention. In FIG. 16A a rotatable magnet assembly 700 includes an circular array of horizontal bar magnets 705 arranged like the spokes of a wheel. The same first magnetic poles 710A of each horizontal bar magnet 705 are arranged in a circle a uniform distance from a geometric center 715 of magnet assembly 700. The same second magnetic poles 710B of each horizontal bar magnet 705 arranged in a circle a uniform distance from a geometric center 715 of magnet assembly 700, but closer to geometric center 715 than first magnetic poles 710A. Magnet assembly 700 is rotatable about a rotation axis 720 located between the circle of first magnetic poles 710A and the circle of second magnetic poles 710B. First magnetic poles 710A of each horizontal bar magnet 705 are in electrical contact with an outer ring 725 and second magnetic poles 710B of each horizontal bar magnet 705 are in electrical contact with an inner ring 730. Outer ring 725 and inner disk 730 are fabricated from electrically conductive magnetic materials.

Turning to FIG. 16B, horizontal bar magnets 705 are attached to an outer ring 725 and an inner disk 730. The subassembly formed of inner ring 730, outer ring 725 and horizontal bar magnets 705 is fastened to a support plate 735 fabricated from electrically conductive but non-magnetic material.

FIG. 17 is a cross-sectional view through an exemplary magnetron cathode assembly according to the present invention. In FIG. 17, a magnetron cathode assembly 800 includes magnet assembly 500 (the same as illustrated in FIGS. 14A and 14B and described supra) and cathode assembly 200B (the same as illustrated in FIG. 11D and described supra) fitted into a housing 805 having a moveable plate 810 free to move up and down relative to housing 805. Cathode assembly 200B is fixed to housing 805 by seals 815. Magnet assembly 500 is rotatably fixed to moveable plate 810 by a bearing/seal 820 and gap distance G between lower ring 530 and lower disk 540 and backing plate 215B is adjustable by moving moveable plate 810 up and down in housing 805. A void 830 is defined by moveable plate 810, top surface 220B of housing 215B and backing plate 215B. Void 830 may be filled with a coolant such as water or an inert gas.

Center of rotation 520 of magnet assembly 500 is coincident with an axis perpendicular to top surface 220B of backing plate 215B and running through the geometric center of cathode assembly 200B. Outer magnets 505 are aligned to inner and outer pole extenders 205B and 210B. Alignment of inner magnets 510 to inner pole extender 205B is variable.

While magnet assembly 500 and cathode assembly 210B (using rectangular cross section pole extenders contained totally with the backing plate) have been illustrated in FIG. 17, any combination of magnet assemblies, cathode assemblies and cross sectional pole extender geometries and vertical locations of pole extenders described supra may be substituted. Not all pole extenders of a given apparatus need be comprised of the same material, be the same length (in the vertical direction) or be embedded in the backing plate and/or sputter target to the same distances.

Thus the present invention provides an efficient magnetron sputtering cathode.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, while the present invention was described using permanent magnets, electro-magnets may be subsituted. Further, additional non-rotating magnets may be provided. Therefore, it is intended that the following claims cover all such modifications and changes as fall within the true spirit and scope of the invention.

What is claimed is:

1. A method of sputter deposition, comprising:
providing a sputter target assembly, said sputter target assembly including:
an electrically conductive solid circular sputter target having a back surface and an exposed front surface and comprised of a first material, said sputter target having inner and outer annular circular slots open to said back surface;
an electrically conductive solid circular backing plate having a back surface and a front surface and comprised of a non-magnetic second material, a perimeter of said backing plate positioned over a perimeter of said sputter target, said front surface of said backing plate in physical and electrical contact with said back surface of said sputter target;
inner and outer ring shaped pole extenders positioned and contained entirely in respective said inner and outer slots in said sputter target, said pole extenders comprised of a magnetic third material; and
a protective coating on all surfaces of said pole extenders said protective coating preventing chemical or galvanic reaction between and first and second materials and said third material;
placing said sputter target assembly over a magnet assembly, said magnet assembly comprising:
an outer set of bar magnets having first and second poles and mounted equidistant from each other in a circle proximate to a perimeter of a mounting plate, first poles of each magnet of said outer set of magnetic positioned facing said mounting plate; and
an inner set of bar magnets having first and second poles and mounted equidistant from each other in a circle between said outer set of magnets and a geometric center of said mounting plate, second poles of each magnet of said inner set of magnets positioned facing said mounting plate, said first poles of said inner and outer sets of magnets being the same magnetic polarity and said second poles of said inner and outer sets of magnets being the same magnetic polarity and opposite from said first polarity;
initially aligning a first magnet of said outer set of magnets under said outer pole extender and a second magnet of said outer set of magnets under said inner pole extender and aligning a third magnet of said inner set of magnets under said inner pole extender, said first, second and third magnets arranged in a straight line, an axis passing through a geometric center of the sputter target assembly co-axially aligned with a center of rotation of said mounting plate, a center of said mounting plate offset horizontally from said center of rotation, second poles of each magnet of said outer set of magnets positioned facing said outer pole extender and first poles of each magnet of said inner set of magnets positioned facing said inner pole extender; and rotating said magnet assembly about an axis parallel to and perpendicularly offset from said axis passing through said geometric center of said magnet assembly.

* * * * *